United States Patent
Hase (10) Patent No.: US 11,418,151 B2
(45) Date of Patent: Aug. 16, 2022

(54) POWER AMPLIFIER CIRCUIT

(71) Applicant: Murata Manufacturing Co., Ltd., Kyoto (JP)

(72) Inventor: Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/928,084

(22) Filed: Jul. 14, 2020

(65) Prior Publication Data
US 2020/0343863 A1    Oct. 29, 2020

Related U.S. Application Data

(63) Continuation of application No. PCT/JP2019/001688, filed on Jan. 21, 2019.

(30) Foreign Application Priority Data

Jan. 23, 2018 (JP) .............................. JP2018-008868

(51) Int. Cl.
*H03F 1/32* (2006.01)
*H03F 1/56* (2006.01)
*H03F 3/21* (2006.01)

(52) U.S. Cl.
CPC ................. *H03F 1/32* (2013.01); *H03F 1/56* (2013.01); *H03F 3/211* (2013.01); *H03F 2200/165* (2013.01); *H03F 2200/222* (2013.01)

(58) Field of Classification Search
CPC ... H03F 1/32; H03F 1/56; H03F 3/211; H03F 2200/165; H03F 2200/222
(Continued)

(56) References Cited

U.S. PATENT DOCUMENTS

2001/0048346 A1    12/2001    Matsuura et al.
2003/0071684 A1*   4/2003     Noori .................... H03F 1/3258
                                                    330/149
(Continued)

FOREIGN PATENT DOCUMENTS

JP     S5573115 A  *  6/1980  ............... H03F 3/56
JP     S5573115 A     6/1980
(Continued)

OTHER PUBLICATIONS

Yong et al. "A Design of Predistortion Linearizer Using Second Harmonic Signals", The Journal of Korean Institute of Electromagnetic Engineering and Science, 16(12), 2005 (Year: 2005).*
(Continued)

*Primary Examiner* — Hafizur Rahman
(74) *Attorney, Agent, or Firm* — Pearne & Gordon LLP (57) ABSTRACT

Provided is a power amplifier circuit that reduces the effect of intermodulation distortion without necessarily increase in the circuit size. The power amplifier circuit includes a first amplifier that amplifies a first signal and output a second signal, an extraction circuit that extracts a second-harmonic wave included in the second signal, a phase adjustment circuit that adjusts the phase of the extracted second-harmonic wave, and a power combiner that combines the second-harmonic wave of the adjusted phase with a third signal and output the first signal.

9 Claims, 7 Drawing Sheets

(58) Field of Classification Search
USPC .......................................................... 330/297
See application file for complete search history.

(56) References Cited

U.S. PATENT DOCUMENTS

| | | | |
|---|---|---|---|
| 2005/0242877 A1 | 11/2005 | Kusunoki et al. | |
| 2008/0058001 A1 | 3/2008 | Kusunoki | |
| 2012/0099624 A1* | 4/2012 | Nagaya | H04B 1/525 |
| | | | 375/219 |
| 2017/0338775 A1 | 11/2017 | Shounai et al. | |

FOREIGN PATENT DOCUMENTS

| | | |
|---|---|---|
| JP | H05243860 A | 9/1993 |
| JP | 2000232325 A | 8/2000 |
| JP | 2001217659 A | 8/2001 |
| JP | 2002057533 A | 2/2002 |
| JP | 2002064340 A | 2/2002 |
| JP | 2008061123 A | 3/2008 |
| JP | 2008219453 A | 9/2008 |
| JP | 2017208729 A | 11/2017 |

OTHER PUBLICATIONS

Jeon et al. "An analog linearizer using second harmonic signal mixing operation" Microwave Conference Proceedings, 2005. APMC 2005 (Year: 2005).*

Jeon et al., "An Analog Linearizer Based on Amplitude Modulation with Even Harmonic Signals", Microwave Journal, Feb. 2009 (Year: 2009).*

Singh et al., "Second- and Third-order Signal Predistortion for Nonlinear Distortion Suppression in a Traveling Wave Tube", IEEE Transactions on Electron Devices 52(5):709-717, Jun. 2005 (Year: 2005).*

Kaho et al., "A Distortion Control Technique for Achieving High Power Efficiency in an HPA Array", IEEE Transactions on Microwave Theory and Techniques, vol. 50, No. 11, Nov. 2002, pp. 2505-2512. (Year: 2002).*

International Search Report issued in Application No. PCT/JP2019/001688, dated Mar. 26, 2019.

Written Opinion issued in Application No. PCT/JP2019/001688, dated Mar. 26, 2019.

* cited by examiner

POWER AMPLIFIER CIRCUIT

This is a continuation of International Application No. PCT/JP2019/001688 filed on Jan. 21, 2019 which claims priority from Japanese Patent Application No. 2018-008868 filed on Jan. 23, 2018. The contents of these applications are incorporated herein by reference in their entireties.

BACKGROUND

Technical Field

The present disclosure relates to a power amplifier circuit.

Mobile communication devices, such as mobile phones include power amplifiers for amplifying electric power of transmit signals. In the case in which, for example, a plurality of signals with adjacent frequencies are inputted to the power amplifier, these signals may cause intermodulation distortion (IMD) and gain linearity may become worse. In this regard, with the aim of reducing the effect of such intermodulation distortion, a technology of deliberately inserting a harmonic wave in a signal path to cancel out intermodulation distortion components has been developed. For example, Patent Document 1 discloses a distortion compensating and power amplifying apparatus in which the output of an amplifier of a first stage is split into a fundamental wave and a second-harmonic wave, the second-harmonic wave is changed in phase and amplitude, the second-harmonic wave is then combined with the fundamental wave, and the resultant wave is inputted to another amplifier of a posterior stage, so that compensation for intermodulation distortion is achieved.

Patent Document 1: U.S. Patent Application Publication No. 2005/0242877

BRIEF SUMMARY

In the configuration disclosed in Patent Document 1, one amplifier different from the amplifier that causes intermodulation distortion is provided and the one amplifier generates a second-harmonic wave.
However, demand for downsizing mobile communication devices, such as mobile phones has risen. Hence, it is desired to reduce the effect of intermodulation distortion without necessarily increasing the circuit size and improve the linearity.

The present disclosure provides a power amplifier circuit that reduces the effect of intermodulation distortion without necessarily increase in the circuit size.

A power amplifier circuit according to an aspect of the present disclosure includes a first amplifier configured to amplify a first signal and output a second signal, an extraction circuit configured to extract a second-harmonic wave included in the second signal, a phase adjustment circuit configured to adjust the phase of the extracted second-harmonic wave, and a power combiner configured to combine the second-harmonic wave of the adjusted phase with a third signal and output the first signal.

The present disclosure can provide a power amplifier circuit that reduces the effect of intermodulation distortion without necessarily increase in the circuit size.

DETAILED DESCRIPTION

Hereinafter, embodiments of the present disclosure are described in detail with reference to the drawings. It should be noted that the same elements are assigned the same reference characters and redundant descriptions are omitted.

Figure 1:
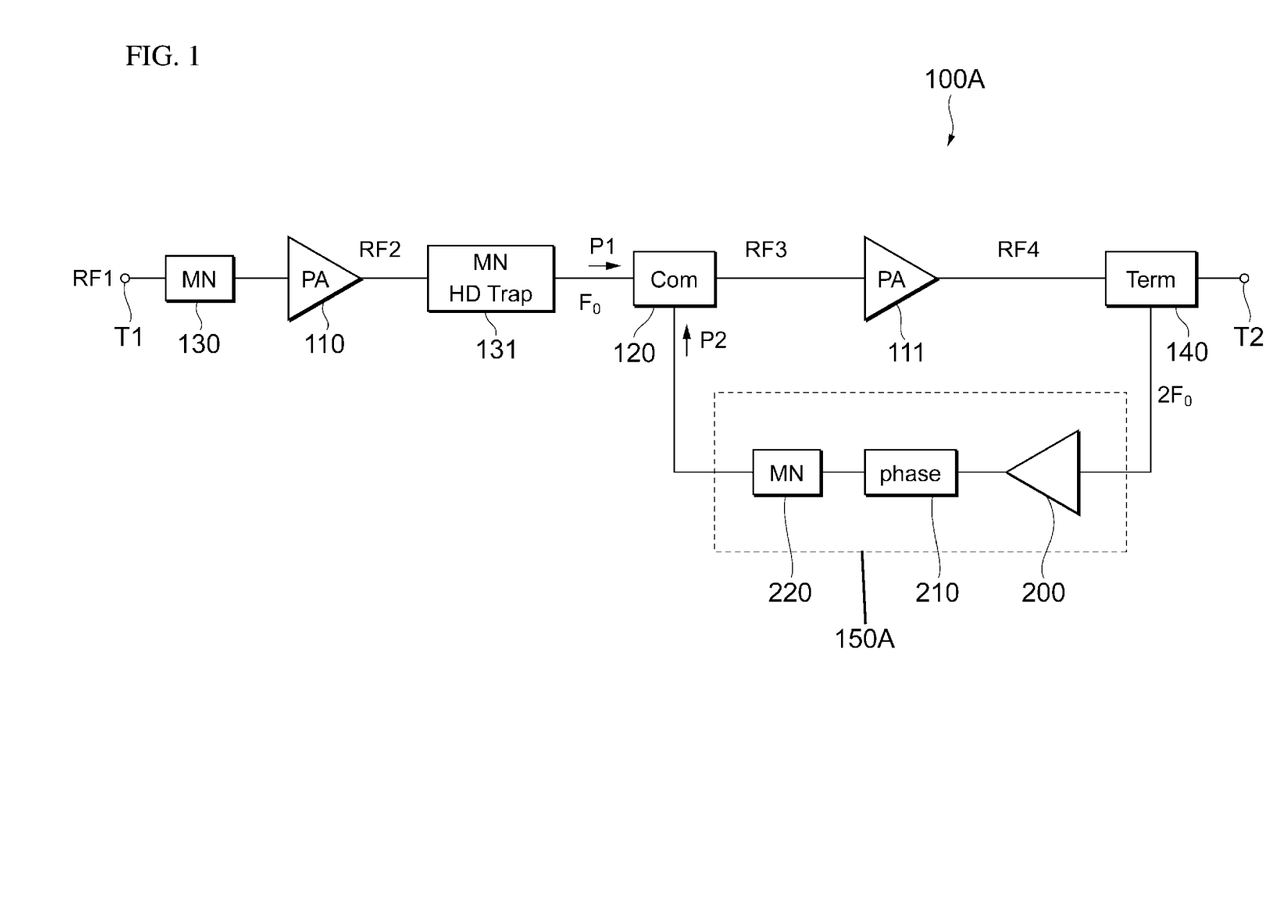
FIG. 1 is a diagram illustrating a configuration example of a power amplifier circuit according to a first embodiment of the present disclosure.

FIG. 1 is a diagram illustrating a configuration example of a power amplifier circuit according to a first embodiment of the present disclosure. A power amplifier circuit 100A illustrated in FIG. 1 is provided in, for example, a mobile communication device, such as a mobile phone and used for amplifying electric power of radio frequency (RF) signals to be transmitted to base stations. The power amplifier circuit 100A amplifies power of signals of communication standards, such as the second-generation (2G) mobile communication system, the third-generation (3G) mobile communication system, the fourth-generation (4G) mobile communication system, the fifth-generation (5G) mobile communication system, Long-Term Evolution Frequency-Division Duplex (LTE-FDD), Long-Term Evolution Time-Division Duplex (LTE-TDD), LTE-Advanced, and LTE-Advanced Pro. The frequency of RF signals ranges, for example, from about several hundreds of MHz to about several tens of GHz. The communication standard and the frequency of signals amplified by the power amplifier circuit 100A are not limited to these examples.

The power amplifier circuit 100A includes, for example, amplifiers 110 and 111, a power combiner 120, matching circuits 130 and 131, a harmonic-wave extraction circuit 140, a distortion compensation circuit 150A, an input terminal T1, and an output terminal T2. The power amplifier circuit 100A also includes a primary path P1 and a secondary path P2.

The amplifier 110 (a third amplifier) and the amplifier 111 (a first amplifier) both amplify inputted RF signals and output the RF signals. This means that the power amplifier circuit 100A amplifies electric power in two stages. Specifically, the amplifier 110 of a first stage (a drive stage) amplifies an RF signal RF1 (a fourth signal) inputted from the input terminal T1 via the matching circuit 130 and outputs an RF signal RF2 (a third signal). The amplifier 111 of a posterior stage (a power stage) amplifies an RF signal RF3 (a first signal) resulting from combination by the power combiner 120 described later and outputs an RF signal RF4 (a second signal). The RF signals RF2 and RF4, each includes a harmonic wave including the second-harmonic wave generated by amplification of the amplifier 110 or 111. The amplifiers 110 and 111 are both configured by using bipolar transistors, such as heterojunction bipolar transistors (HBTs). The amplifiers 110 and 111 may be configured by using field effect transistors (MOSFETs: Metal-oxide-semiconductor Field-Effect Transistors) instead of HBTs.

The primary path P1 is a path starting from the input terminal T1 and leading to the output terminal T2 via the amplifiers 110 and 111. The primary path P1 is a path along which a fundamental wave $F_0$ of the RF signal RF1 travels. The secondary path P2 is a path starting from the harmonic-wave extraction circuit 140 and leading to the power combiner 120 via the distortion compensation circuit 150A, which forms a feedback circuit. The secondary path P2 is a path for generating a second-harmonic wave $2F_0$ to be inputted to compensate for third-order intermodulation distortion caused at the amplifier 111 of the posterior stage.

The power combiner 120 outputs the RF signal RF3 (the first signal) by combining the fundamental wave $F_0$ having traveled along the primary path P1 and the second-harmonic wave $2F_0$ having traveled along the secondary path P2 with each other. The generated RF signal RF3 is outputted to the amplifier 111 of the posterior stage.

The matching circuit 130 (MN: Matching Network) performs impedance matching between a circuit (not illustrated in the drawing) provided in an anterior stage and the amplifier 110.

The matching circuit 131 is provided between the amplifier 110 and the power combiner 120 and performs impedance matching between the amplifiers 110 and 111. The matching circuit 131 also has a function of attenuating harmonic distortion (HD) caused by amplification of the amplifier 110. This means that the matching circuit 131 is configured as a specific example of a second-harmonic-wave attenuation circuit. This configuration hinders output of the second-harmonic wave to the power combiner 120 through the primary path P1. Specifically, the matching circuit 131 may be, for example, a low-pass-filter (LPF) circuit having a frequency characteristic of passing the fundamental wave and attenuating the second-harmonic wave.

The harmonic-wave extraction circuit 140 is provided in a subsequent stage after the amplifier 111. The harmonic-wave extraction circuit 140 extracts the second-harmonic wave $2F_0$ included in the RF signal RF4 and inputs at least part of the second-harmonic wave $2F_0$ to the distortion compensation circuit 150A. The remainder of the signal from which the second-harmonic wave $2F_0$ has been extracted by the harmonic-wave extraction circuit 140 is outputted as a transmit signal from the output terminal T2. In the present embodiment, for example, a harmonic termination circuit that grounds a harmonic wave is used as the harmonic-wave extraction circuit 140. In this case, for example, the harmonic termination circuit may be configured to divide a second-harmonic wave inputted to the harmonic termination circuit, and then, input one part of the second-harmonic wave to the distortion compensation circuit 150A and ground the other part of the second-harmonic wave. With this configuration, the harmonic-wave extraction circuit can be formed without necessarily increase in the circuit size. The harmonic-wave extraction circuit 140 is not limited to the configuration using a harmonic termination circuit, but a filter circuit or the like that extracts only the second-harmonic wave from the RF signal RF4 may be used.

The distortion compensation circuit 150A is provided on the secondary path P2 between the harmonic-wave extraction circuit 140 and the power combiner 120. The distortion compensation circuit 150A is a circuit configured to adjust the amplitude and the phase of the second-harmonic wave $2F_0$, which is deliberately added to compensate for the third-order intermodulation distortion, and outputs the second-harmonic wave $2F_0$. Specifically, the distortion compensation circuit 150A includes, for example, an amplitude adjustment circuit 200, a phase adjustment circuit 210, and a matching circuit 220.

The amplitude adjustment circuit 200 adjusts the amplitude of the second-harmonic wave $2F_0$ extracted by the harmonic-wave extraction circuit 140 and inputs the adjusted second-harmonic wave $2F_0$ to the phase adjustment circuit 210. Since the distortion compensation circuit 150A includes the amplitude adjustment circuit 200, the power of the second-harmonic wave $2F_0$ can be adjusted in accordance with the level of output power of the transmit signal. The amplitude adjustment circuit 200 may configured as, for example, an amplifier (a second amplifier) that increases the power of the second-harmonic wave. With this configuration, as the output power of the transmit signal is increased, the power of the second-harmonic wave $2F_0$ can be increased. Alternatively, in the case in which the power of the second-harmonic wave $2F_0$ is high relative to a power level required for distortion compensation, the amplitude adjustment circuit 200 may be configured as an attenuator.

The phase adjustment circuit 210 is provided in, for example, a subsequent stage after the amplitude adjustment circuit 200. The phase adjustment circuit 210 performs adjustment to render the phase of the inputted second-harmonic wave $2F_0$ suitable for distortion compensation and outputs the second-harmonic wave $2F_0$.

The matching circuit 220 performs impedance matching between the phase adjustment circuit 210 and the power combiner 120.

With the configuration described above, the distortion compensation circuit 150A can adjust the amplitude and the phase of the second-harmonic wave $2F_0$ to be deliberately inputted to the input of the amplifier 111 of the posterior stage. The order in which the components included in the distortion compensation circuit 150A are arranged is not limited to this example and may be changed as appropriate. For example, the amplitude adjustment circuit 200 may be provided in a subsequent stage after the phase adjustment circuit 210. Furthermore, the power combiner 120, the matching circuits 130, 131, and 220, the harmonic-wave extraction circuit 140, and the phase adjustment circuit 210 may be each configured to include elements, such as an inductor and a capacitor, or a resonator using acoustic waves, such as a surface-acoustic-wave (SAW) filter.

Figure 2:
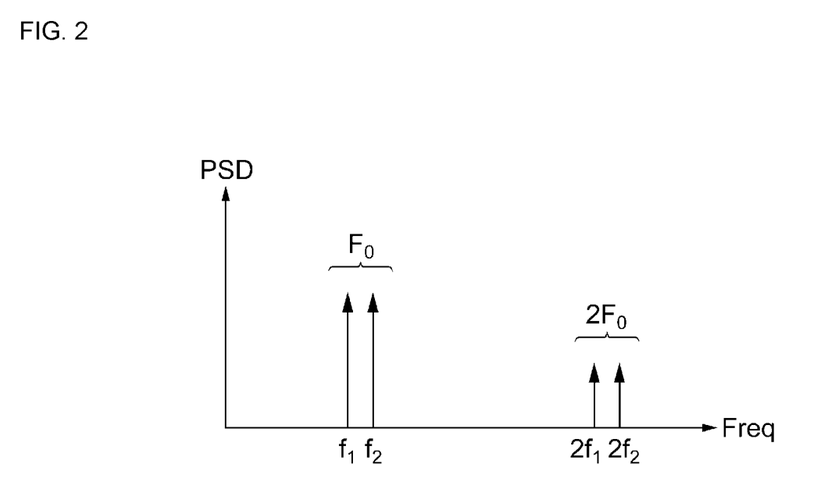
FIG. 2 is a diagram illustrating the spectrum of a signal inputted to an amplifier 111 of a posterior stage.
Figure 3:
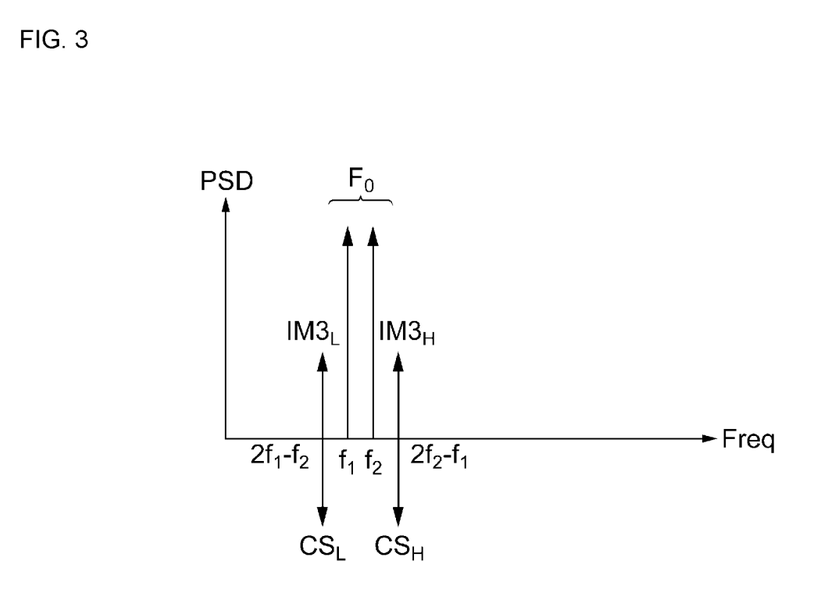
FIG. 3 is a diagram illustrating part of the spectrum of a signal outputted from the amplifier 111 of the posterior stage.

Next, with reference to FIGS. 2 and 3, effects of compensation for third-order intermodulation distortion are described. FIG. 2 is a diagram illustrating the spectrum of a signal, which is the RF signal RF3 in FIG. 1, inputted to the amplifier 111 of the posterior stage. FIG. 3 is a diagram illustrating part of the spectrum of a signal, which is the RF signal RF4 in FIG. 1, outputted from the amplifier 111 of the posterior stage. In graphs illustrated in FIGS. 2 and 3, the horizontal axes indicate the frequency of the signal and the vertical axes indicate the power spectral density (PSD).

As indicated in FIG. 2, the fundamental wave $F_0$ having traveled along the primary path P1 and the second-harmonic wave $2F_0$ having traveled along the secondary path P2 are inputted to the amplifier 111 of the posterior stage. Here, the fundamental wave $F_0$ contains components of two kinds of frequencies $f_1$ and $f_2$ ($f_1<f_2$) adjacent to each other. In this case, the second-harmonic wave of each of the two kinds of frequencies $f_1$ and $f_2$ is extracted by the harmonic-wave extraction circuit 140, and thus, the second-harmonic wave $2F_0$ contains components of two kinds of frequencies $2f_1$ and $2f_2$. As such, signals at the frequencies $f_1$ and $f_2$ and signals at the frequencies $2f_1$ and $2f_2$ are inputted together to the amplifier 111.

Subsequently, as the effect of amplification of the amplifier 111, an amplified signal obtained by amplifying the fundamental wave $F_0$ is outputted as indicated in FIG. 3. Additionally, as the effect of amplification of the amplifier 111, third-order intermodulation distortion $IM3_L$ with a frequency $2f_1-f_2$ occurs on a low-frequency side with respect to the fundamental wave $F_0$ while third-order intermodulation distortion $IM3_H$ with a frequency $2f_2-f_1$ occurs on a high-frequency side with respect to the fundamental wave $F_0$. The third-order intermodulation distortions $IM3_L$ and $IM3_H$ are relatively close to the frequencies $f_1$ and $f_2$ of the fundamental wave $F_0$, and hence, it is difficult to remove the third-order intermodulation distortions $IM3_L$ and $IM3_H$ by using a filter circuit or the like. The third-order intermodulation distortions $IM3_L$ and $IM3_H$ can be, therefore, a cause of deterioration of linearity of the amplifier. The amplification of the amplifier 111 also causes, for example, other kinds of distortion, such as third-order intermodulation distortions with frequencies $2f_1+f_2$ and $2f_2+f_1$, but the frequencies of the distortions are relatively far from the frequencies $f_1$ and $f_2$ of the fundamental wave $F_0$ and descriptions thereof is thus omitted here.

For the purpose of compensating for the third-order intermodulation distortions $IM3_L$ and $IM3_H$, which is relatively close to the fundamental wave $F_0$, compensation signals $CS_L$ and $CS_H$ that cancel out the third-order intermodulation distortions $IM3_L$ and $IM3_H$ are generated by deliberately adding the second-harmonic wave $2F_0$ in this embodiment. Specifically, a signal obtained by adding the fundamental wave $F_0$ and the second-harmonic wave $2F_0$ in the power combiner 120 is inputted to the amplifier 111, and as a result, the compensation signal $CS_L$ with a frequency $(2f_1-f_2)$, which is a difference between the frequency $2f_1$ as one frequency of the second-harmonic wave $2F_0$ and the frequency $f_2$ as the other frequency of the fundamental wave $F_0$, is generated. Additionally, a compensation signal $CS_H$ with a frequency $(2f_2-f_1)$, which is a difference between the frequency $2f_2$ as the other frequency of the second-harmonic wave $2F_0$ and the frequency $f_1$ as one frequency of the fundamental wave $F_0$, is generated. These compensation signals $CS_L$ and $CS_H$ are respectively identical in frequency to the third-order intermodulation distortions $IM3_L$ and $IM3_H$. Furthermore, the phase adjustment circuit 210 changes the phase of the second-harmonic wave $2F_0$ in such a manner that the compensation signals $CS_L$ and $CS_H$ are almost opposite in phase to the third-order intermodulation distortions $IM3_L$ and $IM3_H$ at the output of the amplifier 111. Moreover, the amplitude adjustment circuit 200 adjusts the amplitude of the second-harmonic wave $2F_0$ in such a manner that the compensation signals $CS_L$ and $CS_H$ and the third-order intermodulation distortions $IM3_L$ and $IM3_H$ cancel each other out at the output of the amplifier 111 with respect to amplitude. As such, as illustrated in FIG. 3, the compensation signals $CS_L$ and $CS_H$ cancel out the third-order intermodulation distortions $IM3_L$ and $IM3_H$. In FIG. 3, the compensation signals $CS_L$ and $CS_H$ are drawn in a downward direction to indicate that the compensation signals $CS_L$ and $CS_H$ are almost opposite in phase to the third-order intermodulation distortions $IM3_L$ and $IM3_H$.

Due to the effect described above, in the power amplifier circuit 100A, it is possible to reduce the effect of the third-order intermodulation distortions $IM3_L$ and $IM3_H$ occurring in the amplifier 111. As a result, the power amplifier circuit 100A can hinder the deterioration of linearity.

Moreover, in the present embodiment, the second-harmonic wave caused by amplification of the amplifier 111 is extracted and the second-harmonic wave is inputted to the input of the amplifier 111 by feedback. This means that the present embodiment does not require newly providing a generation circuit, an amplifier, or the like to generate a second-harmonic wave. As a result, for example, in comparison to the configuration disclosed in Patent Document 1 in which one amplifier different from an amplifier that causes intermodulation distortion is provided, the power amplifier circuit 100A can reduce the effect of intermodulation distortion without necessarily increase in the circuit size.

Furthermore, in the present embodiment, a harmonic termination circuit is used as the harmonic-wave extraction circuit 140. With this configuration, the harmonic-wave extraction circuit can be formed without necessarily increase in the circuit size. Further, since the extracted second-harmonic wave is inputted to the distortion compensation circuit 150A, the distortion compensation circuit 150A does not need to include a filter circuit or the like that attenuates the fundamental wave. This configuration also can suppress increase in the circuit size. Noted that it is not intended to exclude the configuration in which a distortion compensation circuit includes a filter circuit.

The configuration disclosed in Patent Document 1 does not include a circuit between a power divider and a power combiner on a main path to attenuate the second-harmonic wave, and thus, the second-harmonic wave caused by amplification of the amplifier in the first stage passes through the primary path. As a result, in the case in which the second-harmonic wave is generated in a secondary path, the second-harmonic wave having traveled through the primary path and the second-harmonic wave having traveled through the secondary path may cancel each other out when the two kinds of second-harmonic waves are added together at the power combiner. Consequently, the power of the second-harmonic wave additionally inputted to the amplifier 111 may be insufficient. By contrast, in the present embodiment, the function of attenuating the second-harmonic wave is imparted to the matching circuit 131 provided in the primary path P1. With this configuration, in the present embodiment, a high-power second-harmonic wave can be inputted to the amplifier 111 in comparison to the configuration disclosed in Patent Document 1. Therefore, the power amplifier circuit 100A can increase output power and also reduce the effect of intermodulation distortion.

Furthermore, in the present embodiment, the second-harmonic wave caused in the amplifier 111 of the posterior stage (the power stage) is used for additional input. Thus, in comparison to the configuration disclosed in the Patent Document 1 in which the second-harmonic wave occurring in the amplifier of a first stage (a drive stage) is used for additional input, it is possible to input a high-power second-harmonic wave. Hence, also with this configuration, the power amplifier circuit 100A can increase output power and also reduce the effect of intermodulation distortion.

The circuit provided between the amplifier 110 and the power combiner 120 and configured to attenuate a second-harmonic wave in the power amplifier circuit 100A is not limited to the matching circuit 131. For example, instead of the matching circuit 131, an amplifier designed to amplify the frequency range of the fundamental wave $F_0$ may be provided. This enables attenuation of the second-harmonic wave caused by amplification of the amplifier 110 of the first stage. In this case, since the power amplifier circuit includes amplifiers in three stages on the primary path P1, it is possible to further increase the output power of transmit signal. In this case, matching circuits may be provided in both anterior and posterior stages with respect to the amplifier provided instead of the matching circuit 131.

All the components included in the power amplifier circuit 100A illustrated in FIG. 1 are not necessarily provided as individual circuits and one circuit may have a plurality of functions. For example, it is possible that the distortion compensation circuit 150A does not include the matching circuit 220, but instead, the phase adjustment circuit 210 has a function of the matching circuit 220.

While in the embodiment described above the case in which the second-harmonic wave is inputted to the amplifier 111 to compensation for third-order intermodulation distortion is described as an example, it is possible to compensate for higher-order intermodulation distortion. Usually, when the amplifier 111 amplifies a signal with the frequencies $f_1$ and $f_2$, (2N+1)-order intermodulation distortion with frequencies $\{(N+1)f_1-Nf_2\}$ and $\{(N+1)f_2-Nf_1\}$ (N is an integer equal to or greater than 1) is generated. As such, inputting harmonic waves at integer multiples of a fundamental frequency can cancel out intermodulation distortion of these high orders.

Figure 4A:
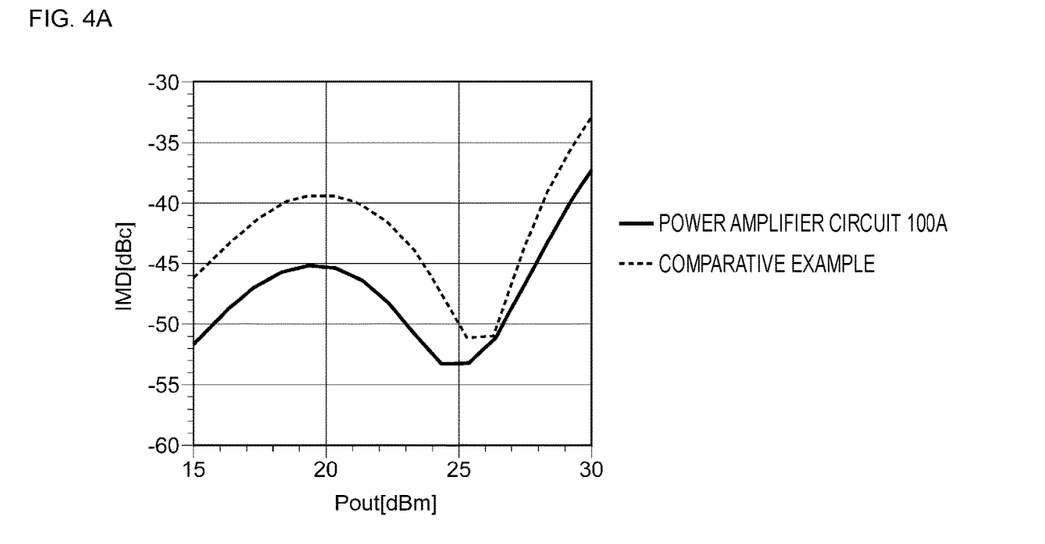
FIG. 4A is a graph indicating simulation results of third-order intermodulation distortion in the power amplifier circuit according to the first embodiment of the present disclosure and a comparative example.
Figure 4B:
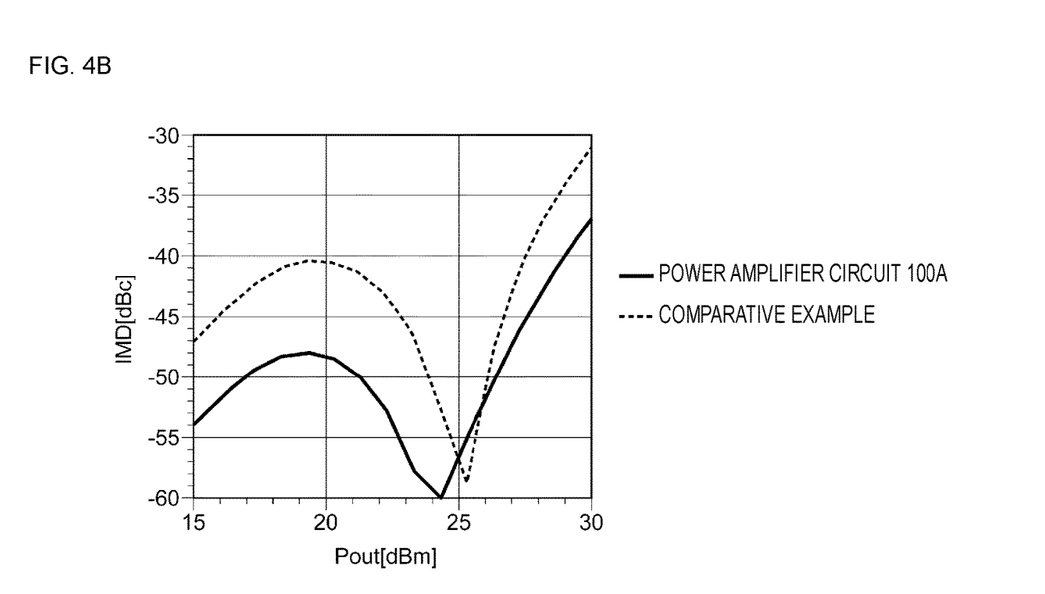
FIG. 4B is a graph indicating simulation results of third-order intermodulation distortion in the power amplifier circuit according to the first embodiment of the present disclosure and the comparative example.

FIGS. 4A and 4B are graphs indicating simulation results of third-order intermodulation distortion in the power amplifier circuit according to the first embodiment of the present disclosure and a comparative example. Here, the comparative example has a configuration formed by excluding the distortion compensation circuit 150A from the power amplifier circuit 100A illustrated in FIG. 1. FIG. 4A illustrates third-order intermodulation distortion on a low-frequency side with respect to the fundamental wave and FIG. 4B illustrates third-order intermodulation distortion on a high-frequency side with respect to the fundamental wave. In the graphs presented in FIGS. 4A and 4B, the horizontal axes indicate the output power Pout (dBm) of transmit signal and the vertical axes indicate the output level (dBc) of third-order intermodulation distortion with respect to the fundamental wave.

As illustrated in FIGS. 4A and 4B, both in the present embodiment and the comparative example, the output level of third-order intermodulation distortion steeply rises after the output level exceeds a particular output power level. However, for example, in the case of comparison of output power when distortion is −40 dBc, referring to FIG. 4A, the output power of the comparative example is approximately 28 dBm while the output power of the present embodiment is approximately 29 dBm, which indicates that the output power of the present embodiment is improved by approximately 1.0 dB as compared to the comparative example. Furthermore, referring to FIG. 4B, the output power of the comparative example is approximately 27.5 dBm while the output power of the present embodiment is approximately 29 dBm, which indicates that the output power of the present embodiment is improved by approximately 1.5 dB as compared to the comparative example. According to these results, it is understood that the present embodiment increases output power and also reduces the effect of intermodulation distortion.

Figure 5:
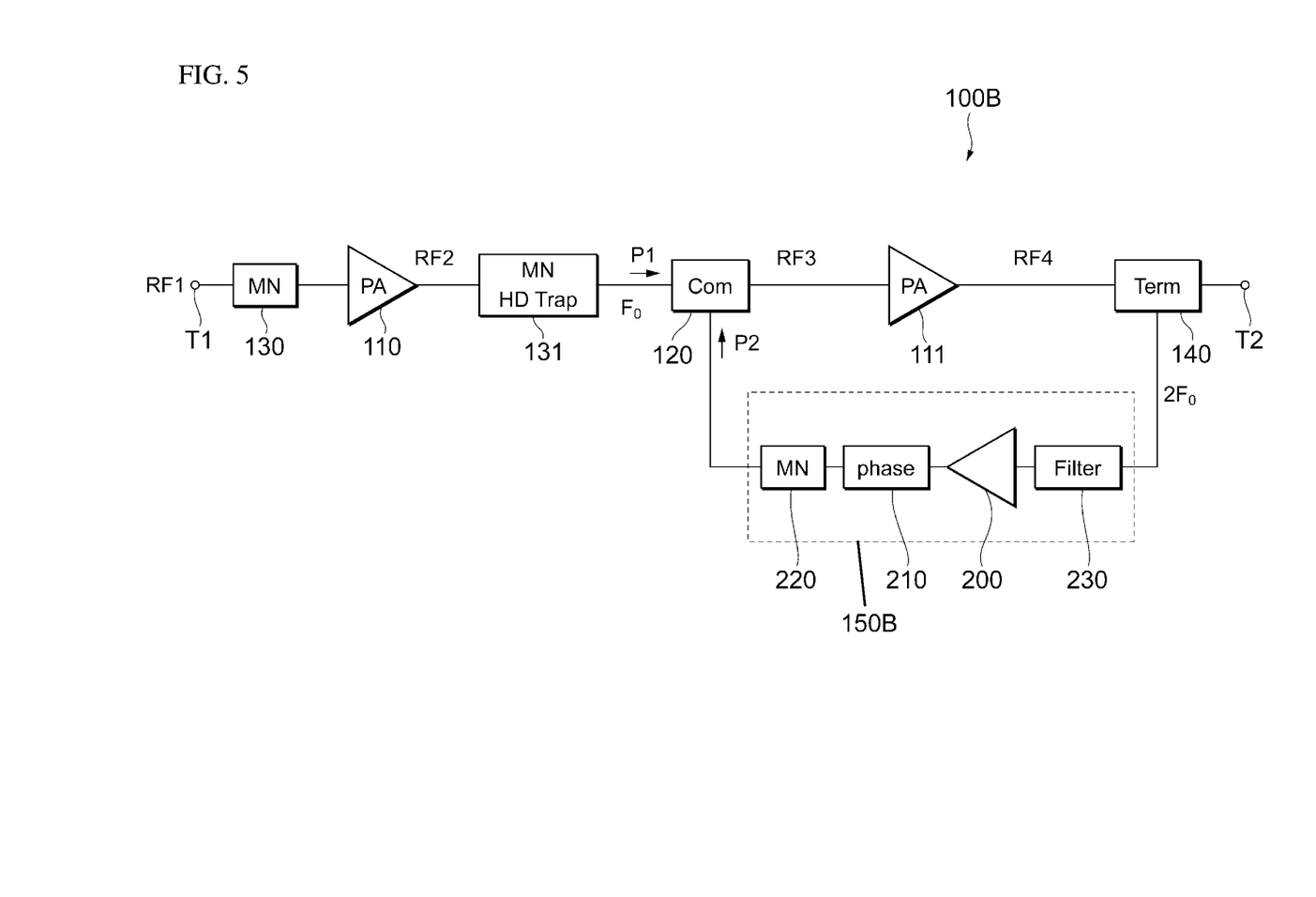
FIG. 5 is a diagram illustrating a configuration example of a power amplifier circuit according to a second embodiment of the present disclosure.

FIG. 5 is a diagram illustrating a configuration example of a power amplifier circuit according to the second embodiment of the present disclosure. In the present embodiment, descriptions about specifics common to those of the first embodiment are not repeated and only different points are explained. In particular, almost identical effects and advantages achieved by almost identical configurations are not mentioned in every embodiment.

A power amplifier circuit 100B illustrated in FIG. 5 includes a distortion compensation circuit 150B instead of the distortion compensation circuit 150A as compared to the power amplifier circuit 100A illustrated in FIG. 1. The distortion compensation circuit 150B further includes a filter circuit 230 as compared to the distortion compensation circuit 150A.

The filter circuit 230 is provided between the harmonic-wave extraction circuit 140 and the power combiner 120 (in the present embodiment, between the harmonic-wave extraction circuit 140 and the amplitude adjustment circuit 200). The filter circuit 230 is provided for the case in which attenuation of the signal excluding the second-harmonic wave is insufficient when the harmonic-wave extraction circuit 140 extracts the second-harmonic wave, so that the filter circuit 230 is configured to attenuate the signal of a frequency different from the frequency of the second-harmonic wave. The configuration of the filter circuit 230 is not limited to any specific example, but the filter circuit 230 may be configured to include, for example, an inductor and a capacitor, or a resonator using acoustic waves, such as a SAW filter.

With this configuration, the power amplifier circuit 100B can improve the reliability of reduction of third-order intermodulation distortion as compared to the power amplifier circuit 100A. The position of the filter circuit 230 in the distortion compensation circuit 150B is not limited to the example described above and may be changed as appropriate. The filter circuit 230 can be positioned in an anterior stage with respect to the amplitude adjustment circuit 200 because the power of the inputted signal is small in comparison to the configuration in which the filter circuit 230 is positioned in a posterior stage with respect to the amplitude adjustment circuit 200.

Figure 6:
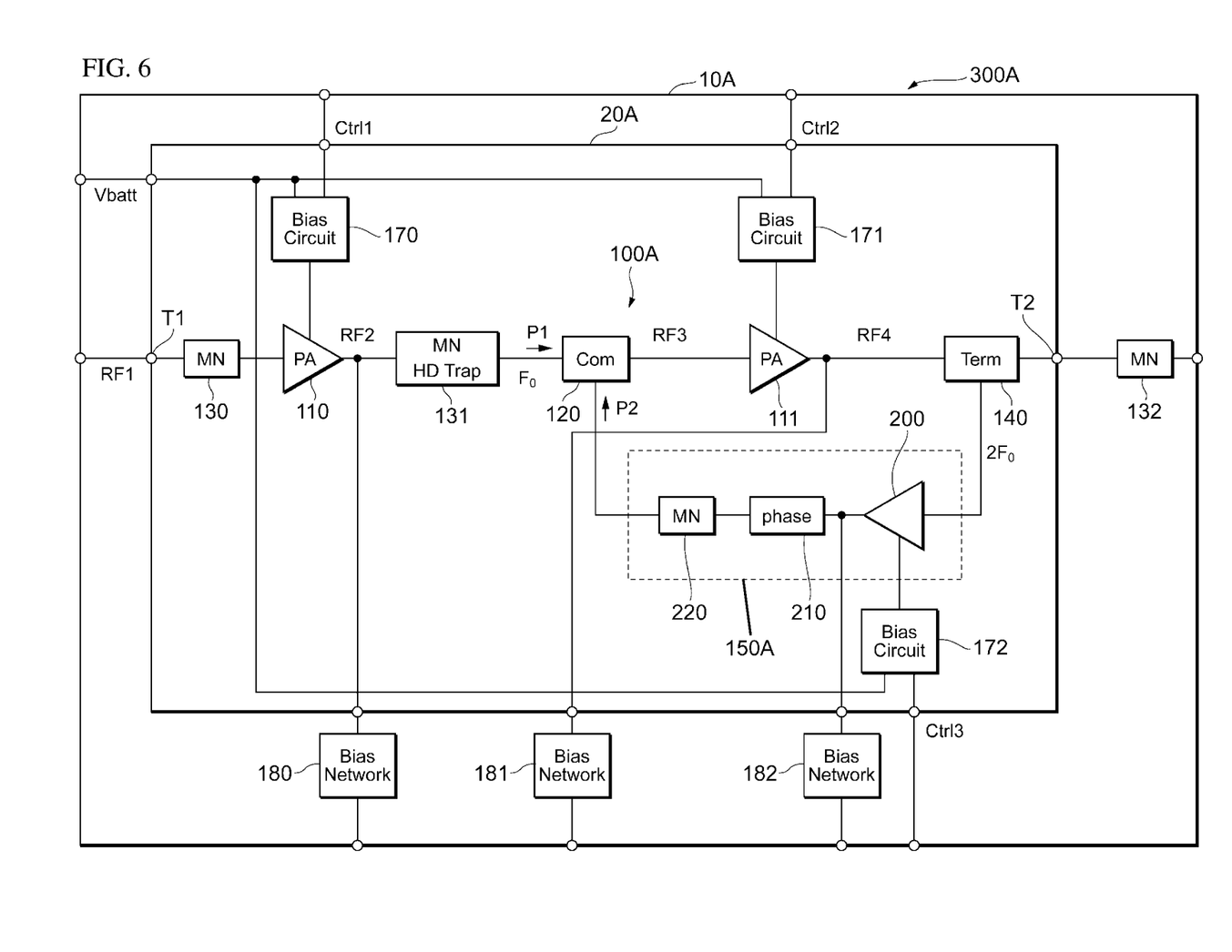
FIG. 6 is a diagram illustrating a configuration example of a transmit module including the power amplifier circuit according to the first embodiment of the present disclosure.

FIG. 6 is a diagram illustrating a configuration example of a transmit module including the power amplifier circuit according to the first embodiment of the present disclosure.

As illustrated in the drawing, a transmit module 300A includes a semiconductor chip 20A, a matching circuit 132, and bias networks 180 to 182, which are provided at a module substrate 10A. At the semiconductor chip 20A, the power amplifier circuit 100A according to the first embodiment and bias circuits 170 to 172 are provided in an integrated manner.

The matching circuit 132 performs impedance matching between the power amplifier circuit 100A provided in an anterior stage and another circuit (not illustrated in the drawing) provided in a posterior stage after the power amplifier circuit 100A. The matching circuit 132 may be formed inside the semiconductor chip 20A.

The bias networks 180 to 182 supply a power supply voltage respectively to the amplifiers 110 and 111, and the amplitude adjustment circuit 200. A battery voltage Vbatt is supplied to the bias circuits 170 to 172 and the bias circuits 170 to 172 in turn supply a bias current or a bias voltage respectively to the amplifiers 110 and 111 and the amplitude adjustment circuit 200 in accordance with control signals Ctrl1 to Ctrl3 inputted from outside of the module substrate 10A.

As described above, since the power amplifier circuit 100A including the distortion compensation circuit 150A and the bias circuits 170 to 172 are provided at the same semiconductor chip 20A in an integrated manner, it is possible to downsize the transmit module in comparison to, for example, a configuration in which the distortion compensation circuit 150A is formed outside the semiconductor chip 20A.

Figure 7:
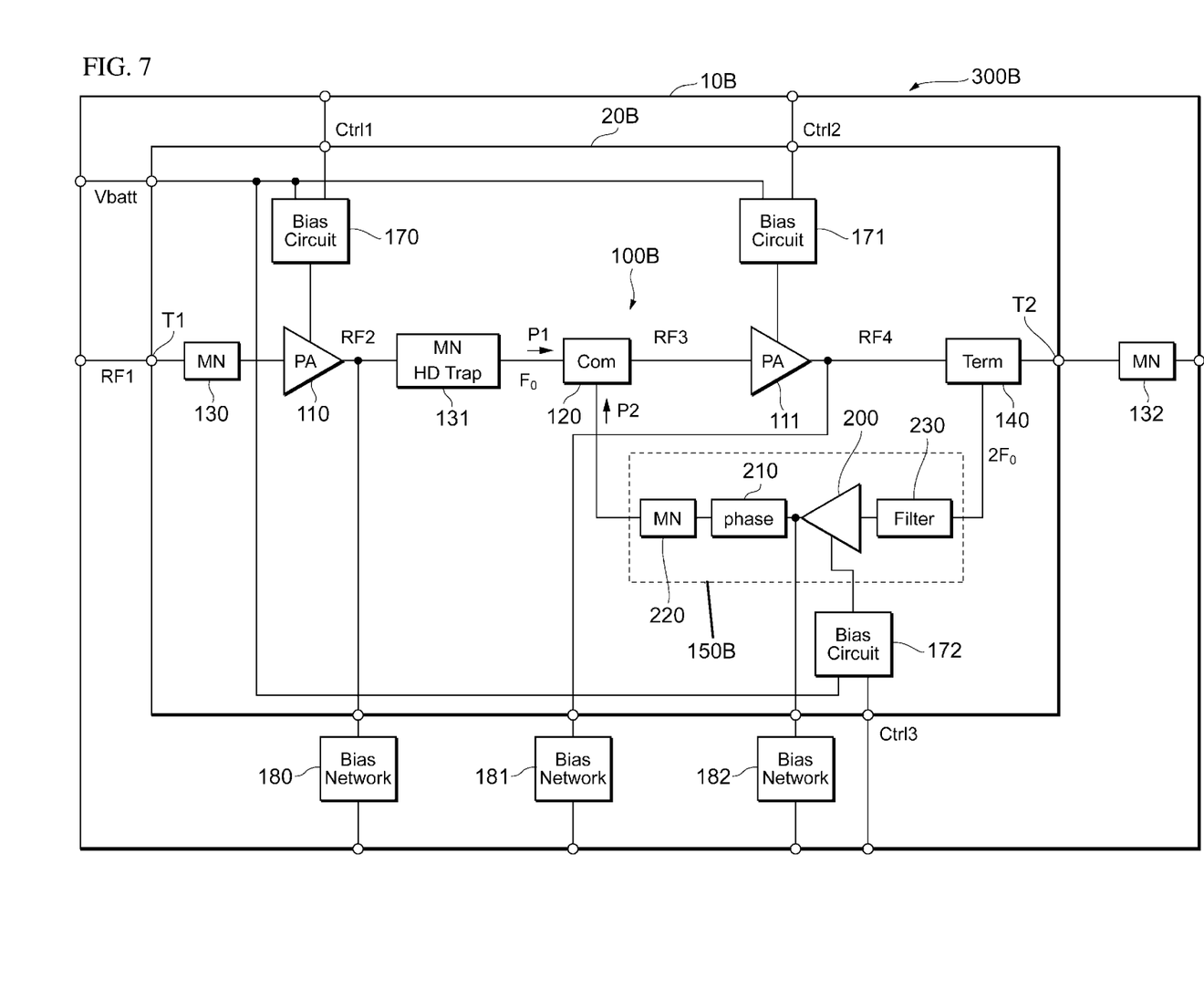
FIG. 7 is a diagram illustrating a configuration example of a transmit module including the power amplifier circuit according to the second embodiment of the present disclosure.

FIG. 7 is a diagram illustrating a configuration example of a transmit module including the power amplifier circuit according to the second embodiment of the present disclosure.

As illustrated in the drawing, a transmit module 300B differs from the transmit module 300A in that a semiconductor chip 20B instead of the semiconductor chip 20A is provided at a module substrate 10B. The semiconductor chip 20B includes the power amplifier circuit 100B according to the second embodiment.

Also in this case, since the power amplifier circuit 100B including the distortion compensation circuit 150B and the bias circuits 170 to 172 are provided at the same semiconductor chip 20B in an integrated manner, it is possible to downsize the transmit module.

Figure 8:
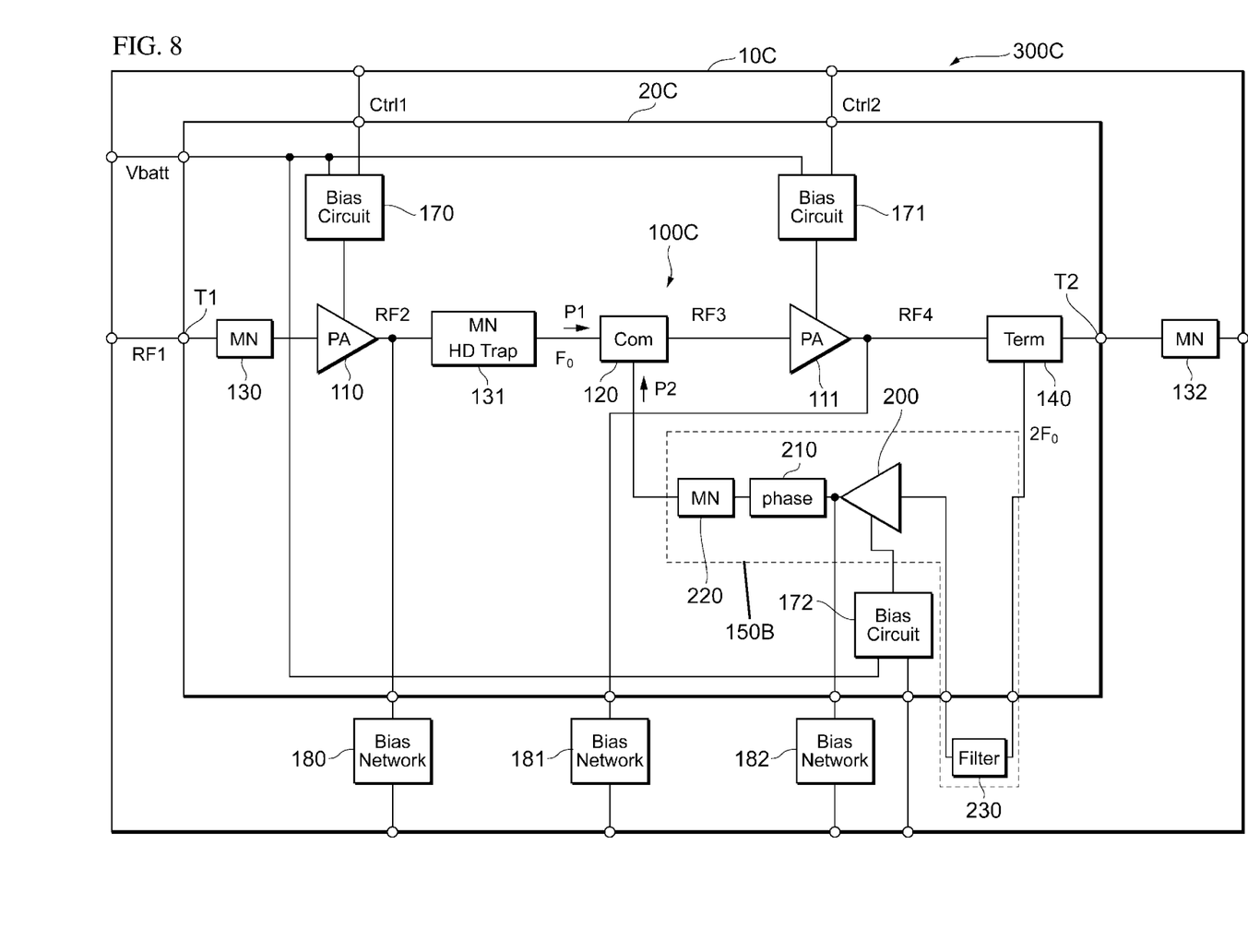
FIG. 8 is a diagram illustrating another configuration example of a transmit module including the power amplifier circuit according to the second embodiment of the present disclosure.

FIG. 8 is a diagram illustrating another configuration example of a transmit module including the power amplifier circuit according to the second embodiment of the present disclosure.

As illustrated in the drawing, a transmit module 300C differs from the transmit module 300A in that the filter circuit 230 included in the distortion compensation circuit 150B is formed outside a semiconductor chip 20C. This means that, in this configuration example, a harmonic wave outputted from the harmonic-wave extraction circuit 140 once moves out of the semiconductor chip 20C and returns again to the semiconductor chip 20C through the filter circuit 230.

With this configuration, in the case in which the filter circuit 230 is configured as, for example, a SAW filter, it is possible to reduce the cost in comparison to a configuration in which the filter circuit 230 is formed at the semiconductor chip 20C. In this case, the filter circuit 230 may be provided at, for example, a module substrate 10C by using a surface mount device (SMD).

The transmit modules 300A to 300C described above may each constitute a high-frequency module in conjunction with a receive module including a low-noise amplifier (LNA). Furthermore, a plurality of any kind of the transmit modules 300A to 300C may constitute a multiband high-frequency module in conjunction with a plurality of receive modules. In this case, the plurality of modules respond respectively to signals at different frequency bands. The multiband high-frequency module may include modules respectively supporting a frequency division duplex (FDD) technique and a time division duplex (TDD) technique.

The exemplary embodiments of the present disclosure have been described above. The power amplifier circuits 100A and 100B includes the amplifier 111 configured to amplify the RF signal RF3 and output the RF signal RF4, the harmonic-wave extraction circuit 140 configured to extract a second-harmonic wave included in the RF signal RF4, the phase adjustment circuit 210 configured to adjust the phase of the extracted second-harmonic wave, and the power combiner 120 configured to combine the second-harmonic wave of the adjusted phase with the RF signal RF2 and output the RF signal RF3. With this configuration, the power amplifier circuits 100A and 100B do not need to additionally include a generation circuit, an amplifier, or the like to generate a second-harmonic wave. As a result, in comparison to the configuration disclosed in Patent Document 1, the power amplifier circuits 100A and 100B can reduce the effect of the intermodulation distortions $IM3_L$ and $IM3_H$ without necessarily increase in the circuit size.

Further, the phase adjustment circuit 210 changes the phase of the second-harmonic wave $2F_0$ in such a manner that the signals obtained as the differences between the second-harmonic wave $2F_0$ and the fundamental wave $F_0$ included in the RF signal RF3 and the third-order intermodulation distortions $IM3_L$ and $IM3_H$ occurring in the amplifier 111 are substantially in antiphase at the output of the amplifier 111. With this configuration, the compensation signals $CS_L$ and $CS_H$ cancel out the third-order intermodulation distortions $IM3_L$ and $IM3_H$, and as a result, it is possible to reduce the effect of intermodulation distortion.

Moreover, the power amplifier circuits 100A and 100B further include the amplitude adjustment circuit 200 configured to adjust the amplitude of the second-harmonic wave $2F_0$ in such a manner that the signals obtained as the differences between the second-harmonic wave $2F_0$ and the fundamental wave $F_0$ included in the RF signal RF3 and the third-order intermodulation distortions $IM3_L$ and $IM3_H$ occurring in the amplifier 111 cancel each other out at the output of the amplifier 111.

With this configuration, the power of the second-harmonic wave $2F_0$ can be adjusted in accordance with the level of output power of the transmit signal.

Furthermore, the amplitude adjustment circuit 200 may be configured as an amplifier that amplifies the power of the second-harmonic wave $2F_0$. With this configuration, as the output power of the transmit signal is increased, the power of the second-harmonic wave $2F_0$ can be increased.

Further, the power amplifier circuits 100A and 100B further include the amplifier 110 configured to amplify the RF signal RF1 and output the RF signal RF2 and the matching circuit 131 provided between the amplifier 110 and the power combiner 120 and configured to attenuate a signal at the frequency of the second-harmonic wave $2F_0$. This configuration avoids the second-harmonic wave having traveled along the primary path P1 and the second-harmonic wave having traveled along the secondary path P2 cancelling each other out at the power combiner 120. As a result, in the power amplifier circuits 100A and 100B, a high-power second-harmonic wave can be inputted to the amplifier 111 in comparison to the configuration disclosed in Patent Document 1.

Moreover, in the transmit module 300C, the power amplifier circuit 100B further includes the filter circuit 230 provided between the harmonic-wave extraction circuit 140 and the power combiner 120 and configured to attenuate a signal at a frequency different from the frequency of the second-harmonic wave. The filter circuit 230 is formed outside the semiconductor chip 20C at which the amplifier 111 is formed. In the case in which the filter circuit 230 is configured as, for example, a SAW filter, it is possible to reduce the cost in comparison to a configuration in which the filter circuit 230 is formed at the semiconductor chip 20C.

The embodiments described above have been made for ease of understanding the present disclosure and should not be construed to limit the present disclosure. The present disclosure can be changed or improved without necessarily departing from its spirit and also includes equivalents thereof. This means that modifications to the embodiments designed by those skilled in the art as appropriate are also embodied in the scope of the present disclosure when the modifications have features of the present disclosure. For example, the elements included in the embodiments, the arrangements thereof, materials, conditions, shapes, sizes are not limited to the examples and may be changed as appropriate. Furthermore, the elements included in the embodiments can be combined with each other when technically possible and combinations thereof may be encompassed in the scope of the present disclosure when the combinations have features of the present disclosure.

REFERENCE SIGNS LIST 10A-10C . . . module substrate, 20A-20C . . . semiconductor chip, 100A, 100B . . . power amplifier circuit, 110, 111 . . . amplifier, 120 . . . power combiner, 130, 131, 132, 220 . . . matching circuit, 140 . . . harmonic-wave extraction circuit, 150A, 150B . . . distortion compensation circuit, 170-172 . . . bias circuit, 180-182 . . . bias network, 200 . . . amplitude adjustment circuit, 210 . . . phase adjustment circuit, 230 . . . filter circuit, 300A-300C . . . transmit module, T1 . . . input terminal, T2 . . . output terminal, P1 . . . primary path, P2 . . . secondary path

The invention claimed is:

1. A power amplifier circuit comprising:
a first amplifier configured to amplify a first signal, and to output a second signal;
an extraction circuit configured to extract a second-harmonic wave included in the second signal;
a phase adjustment circuit configured to adjust a phase of the extracted second-harmonic wave; and
a power combiner configured to combine the phase-adjusted extracted second-harmonic wave with a third signal, and to output the first signal;
a third amplifier configured to amplify a fourth signal, and to output the third signal; and
a second-harmonic-wave attenuation circuit between the third amplifier and the power combiner, the second-harmonic-wave attenuation circuit being configured to attenuate a signal at a frequency of the second-harmonic wave.

2. A power amplifier circuit comprising:
a first amplifier configured to amplify a first signal, and to output a second signal;
an extraction circuit configured to extract a second-harmonic wave included in the second signal;
a phase adjustment circuit configured to adjust a phase of the extracted second-harmonic wave; and
a power combiner configured to combine the phase-adjusted extracted second-harmonic wave with a third signal, and to output the first signal,
wherein the phase adjustment circuit is configured to change the phase of the extracted second-harmonic wave such that a signal obtained as a difference between the second-harmonic wave and a fundamental wave included in the first signal is substantially antiphase with, at an output of the first amplifier, a third-order intermodulation distortion occurring in the first amplifier.

3. A power amplifier circuit comprising:
a first amplifier configured to amplify a first signal, and to output a second signal;
an extraction circuit configured to extract a second-harmonic wave included in the second signal;
a phase adjustment circuit configured to adjust a phase of the extracted second-harmonic wave;
a power combiner configured to combine the phase-adjusted extracted second-harmonic wave with a third signal, and to output the first signal; and
an amplitude adjustment circuit configured to adjust an amplitude of the extracted second-harmonic wave such that a signal obtained as a difference between the second-harmonic wave and a fundamental wave included in the first signal cancels, at an output of the first amplifier, a third-order intermodulation distortion occurring in the first amplifier.

4. The power amplifier circuit according to claim 2, further comprising:
an amplitude adjustment circuit configured to adjust an amplitude of the extracted second-harmonic wave such that the signal obtained as a difference between the second-harmonic wave and the fundamental wave included in the first signal cancels, at the output of the first amplifier, the third-order intermodulation distortion occurring in the first amplifier.

5. The power amplifier circuit according to claim 3, wherein the amplitude adjustment circuit comprises a second amplifier configured to amplify electric power of the extracted second-harmonic wave.

6. The power amplifier circuit according to claim 1, further comprising:
a filter circuit between the extraction circuit and the power combiner, the filter circuit being configured to attenuate a signal at a frequency different than the frequency of the second-harmonic wave,
wherein the filter circuit is arranged outside a semiconductor chip at which the first amplifier is arranged.

7. The power amplifier circuit according to claim 2, further comprising:
a filter circuit between the extraction circuit and the power combiner, the filter circuit being configured to attenuate a signal at a frequency different than a frequency of the second-harmonic wave,
wherein the filter circuit is arranged outside a semiconductor chip at which the first amplifier is arranged.

8. The power amplifier circuit according to claim 3, further comprising:
a filter circuit between the extraction circuit and the amplitude adjustment circuit, the filter circuit being configured to attenuate a signal at a frequency different than a frequency of the second-harmonic wave,
wherein the filter circuit is arranged outside a semiconductor chip at which the first amplifier is arranged.

9. The power amplifier circuit according to claim 3, further comprising:
a filter circuit between the extraction circuit and the power combiner, the filter circuit being configured to attenuate a signal at a frequency different than the frequency of the second-harmonic wave,
wherein the filter circuit is arranged outside a semiconductor chip at which the first amplifier is arranged.

* * * * *